US012181541B2

(12) United States Patent
Mitchell et al.

(10) Patent No.: US 12,181,541 B2
(45) Date of Patent: Dec. 31, 2024

(54) ATOMIC VAPOR CELL, AN INTEGRATED ATOMIC/PHOTONIC DEVICE AND APPARATUS COMPRISING THE ATOMIC VAPOR CELL, AND A METHOD FOR FABRICATING AN ATOMIC VAPOR CELL

(71) Applicants: FUNDACIÓ INSTITUT DE CIENCIES FOTONIQUES, Castelldefels (ES); INSTITUCIÓ CATALANA DE RECERCA I ESTUDIS AVANÇATS, Barcelona (ES); Politecnico Di Milano, Milan (IT); Consiglio Nazionale Delle Ricerche, Rome (IT)

(72) Inventors: Morgan Mitchell, Castelldefels (ES); Vito Giovanni Lucivero, Castelldefels (ES); Roberto Osellame, Rome (IT); Giacomo Corrielli, Rome (IT); Andrea Zanoni, Milan (IT)

(73) Assignees: FUNDACIÓ INSTITUT DE CIÈNCIES FOTÒNIQUES, Castelldefels (ES); INSTITUCIÓ CATALANA DE RECERCA I ESTUDIS AVANÇATS, Barcelona (ES); POLITECNICO DI MILANO, Milan (IT); CONSIGLIO NAZIONALE DELLE RICERCHE, Rome (IT)

( * ) Notice: Subject to any disclaimer, the term of this patent is extended or adjusted under 35 U.S.C. 154(b) by 49 days.

(21) Appl. No.: 18/110,638

(22) Filed: Feb. 16, 2023

(65) Prior Publication Data

US 2023/0273278 A1 Aug. 31, 2023

(30) Foreign Application Priority Data

Feb. 16, 2022 (EP) .................................... 22382127

(51) Int. Cl.
*G01R 33/26* (2006.01)
*G01R 33/46* (2006.01)

(52) U.S. Cl.
CPC ............. *G01R 33/26* (2013.01); *G01R 33/46* (2013.01)

(58) Field of Classification Search
CPC .... G01R 33/26; G01R 33/46; G01R 33/0052; G01R 33/032; G04F 5/14; G04F 5/145;
(Continued)

(56) References Cited

U.S. PATENT DOCUMENTS

2014/0306700 A1 10/2014 Kamada et al.

OTHER PUBLICATIONS

Lucivero et al., Laser-written vapor cells for chip-scale atomic sensing and spectroscopy, Optical Society of America, (Year: 2022).*
(Continued)

*Primary Examiner* — G. M. A Hyder
(74) *Attorney, Agent, or Firm* — Jenkins, Taylor & Hunt, P.A.

(57) ABSTRACT

Provided is an atomic vapor cell, for atomic or molecular spectroscopy, optical pumping, and/or spin-based atomic sensing, that includes a host substrate and defined there within a buried or non-buried chamber laser written in the host substrate without the need of a mask or photoresist, with either planar or three-dimensional geometry, and intended to contain an atomic vapor.

Also provided are an integrated atomic/photonic device and an apparatus, in both cases including the presently disclosed atomic vapor cell, and a method for fabricating the presently disclosed atomic vapor cell.

17 Claims, 5 Drawing Sheets

(58) Field of Classification Search
CPC .......... G01N 24/006; B81B 1/00; B81B 7/02; B81C 1/00023; B81C 1/00047
See application file for complete search history.

(56) References Cited

OTHER PUBLICATIONS

Cutler et al. (2020) "Nanostructured Alkali-Metal Vapor Cells," Physical Review Applied 14(3), pp. 034054-1-034054-13 (Sep. 21, 2020).
Shah et al. (2009) "Spin-Exchange-Relaxation-Free Magnetometry Using Elliptically-Polarized Light," Phys. Rev. A 80, 013416, pp. 1-6.

* cited by examiner

ATOMIC VAPOR CELL, AN INTEGRATED ATOMIC/PHOTONIC DEVICE AND APPARATUS COMPRISING THE ATOMIC VAPOR CELL, AND A METHOD FOR FABRICATING AN ATOMIC VAPOR CELL

CROSS-REFERENCE TO RELATED APPLICATIONS

This application is based on and claims the benefit of priority from European Patent Application No. 22382127, filed on Feb. 16, 2022, the contents of which are expressly incorporated by reference herein.

FIELD OF THE INVENTION

The present invention generally relates, in a first aspect, to an atomic vapor cell, for atomic or molecular spectroscopy, optical pumping (for sensing or non-sensing applications) and/or spin-based atomic sensing, and particularly to an atomic vapor cell comprising a laser written buried or non-buried chamber with either planar or three-dimensional geometry.

A second aspect of the present invention relates to an integrated atomic/photonic device, comprising the atomic vapor cell of the first aspect.

A third aspect of the present invention relates to an apparatus, comprising the atomic vapor cell of the first aspect and/or the integrated atomic/photonic device of the second aspect.

A fourth aspect of the present invention relates to a method for fabricating the atomic vapor cell of the first aspect, for atomic or molecular spectroscopy, optical pumping and/or spin-based atomic sensing.

BACKGROUND OF THE INVENTION

An atomic vapor cell, for atomic or molecular spectroscopy, optical pumping and/or spin-based atomic sensing, including the features defined in the preamble of claim 1 Is known in the prior art, i.e., a cell comprising a host substrate and defined there within a chamber for containing an atomic vapor.

That's the case of several atomic vapor cells fabricated according to different techniques, such as the MEMS (microelectromechanical systems) vapor cells based on planar Si mask etching and bonding with two glass substrates, of the conventional vapor cells made by glassblowing techniques, and of the nanostructured vapor cells made by surface laser lithography and reactive ion etching, such as that disclosed in "Nanostructured Alkali-Metal Vapor Cells", T. F. Cutler et al, Physical Review Applied 14, 034054 (2020).

All those vapor cells suffer from different drawbacks or limitations such as, but not only, the planar geometry of the chambers or surface microchannels, which cannot be fabricated at a desired depth and size in three dimensions, or the need of using masks or photoresists, or the lack of freedom for the selection of the host material, particularly of the need of including non-transparent walls and thus limit the locations and quantity of optical accesses enabled thereby.

In US2014/306700 A1 and in Cutler et al., "Nanostructured Alkali-Metal Vapor Cells", Physical Review Applied, co. 14, no. 3, 21 Sep. 2020, as well as in many other works about microfabricated atomic vapor cells, a mask or a photoresist is used for generating a desired geometry by Net etching of silicon or by surface laser lithography (as in Cutler et al.). These processes are usually performed on the planar surface of a middle wafer (process member in US2014/306700), they need a mask or a photoresist, and they have limited versatility on the geometry of chambers and reservoirs that can be structured.

It is therefore necessary to offer an alternative to the state of the art, which covers the gaps mentioned above, particularly by providing an atomic vapor cell, for atomic or molecular spectroscopy, optical pumping and/or spin-based atomic sensing, which does not have the above mentioned drawbacks and limitations.

SUMMARY OF THE INVENTION

To that end, the present invention relates, in a first aspect, to an atomic vapor cell, for atomic or molecular spectroscopy, optical pumping and/or spin-based atomic sensing, comprising a host substrate and defined there within a chamber for containing an atomic vapor.

In contrast to the atomic vapor cells of the prior art, in the one proposed by the first aspect of the present invention the chamber is a buried or non-buried chamber with either planar or three-dimensional geometry, laser written in the host substrate, i.e., without the need of a mask or photoresist, preferably with a femtosecond laser.

Therefore, the present invention refers to an atomic vapor cell fabricated using a maskless fabrication technique, where a laser enables the writing of three-dimensional geometries inside the host substrate at different depths. This process clearly differs from surface laser lithography and, differently from state-of-the-art, does not require a mask or a photoresist in the etching or writing process.

In the present document, the terms "planar chamber" or "chamber with a planar geometry" are used to refer to a 3D void geometry whose volume shape is a translational solid obtained by the translation of a planar surface of arbitrary shape, parallel with the top facet of the substrate, in the vertical direction (i.e. the direction orthogonal to the top facet of the substrate). The translation is performed by an arbitrary length, defined as the thickness of that "planar chamber".

In contrast, the expression "three-dimensional chamber" or "non-planar geometry", is used to refer to a 3D void geometry whose volume shape is arbitrary, e.g. it can also be obtained by the translation of non-planar surfaces (with respect to the top facet of the substrate) and it can change its cross-section at different depth inside the host material.

For an embodiment, the host substrate and chamber are configured and arranged to enable multiple optical access to an atomic interaction area of the chamber along at least two optical axes.

According to an embodiment, the atomic vapor cell of the first aspect of the present invention further comprises, also laser written in the host substrate, a buried or non-buried reservoir and connecting channels fluidically communicating the chamber with the reservoir, wherein the reservoir is a planar or three-dimensional reservoir.

For an implementation of that embodiment, the reservoir has at least one open end defined at a face of the host substrate and the vapor cell further comprises a sealing substrate bonded to said face of the host substrate to seal said at least one open end, wherein said at least one open end was made to remove excess material from the laser writing process therethrough and to fill the reservoir with said atomic vapor or with a source of material originating said atomic vapor.

For that implementation and for similar implementations, the reservoir and/or other laser-written three-dimensional chambers are buried (hidden inside the host material), however, they need an opening to perform the material removal by a chemical etchant, i.e. they become non-buried. After sealing that opening with a second substrate, they are finally buried again. In microfabricated cells of the prior art, chambers are written or etched by using a mask on the surface of a wafer, hence they are initially non-buried. They become buried after sealing with a second wafer or substrate.

For an embodiment, the chamber comprises at least an inlet connection to fill the same with the atomic vapor from the exterior of the atomic vapor cell, and, for a variant of that embodiment, also an outlet connection to make the atomic vapor enter the chamber through the input connection, flow through the chamber, and exit the chamber through the outlet connection.

According to an embodiment, at least the host substrate is transparent to a determined wavelength of a light beam used for a single or multiple optical access to the chamber for performing the above mentioned atomic or molecular spectroscopy, optical pumping, and/or spin-based atomic sensing.

For an implementation of that embodiment, the chamber has at least a pair of respective opposite ends adjacent to respective opposite side facets of the host substrate, so that optical access along one dimension of the chamber is enabled for a light beam entering the chamber through one of said opposite ends and exits the same through the other of said opposite ends.

For another implementation of that embodiment, for enabling at least a two pass configuration, the chamber has at least two pairs of respective opposite ends adjacent to respective opposite side facets of pairs of opposite side facets of the host substrate, so that multiple optical access along two respective transversal dimensions of the chamber is enabled for two respective light beams, each entering the chamber through one of the opposite ends of a respective pair and exits the same through the other of said opposite ends.

Still for another implementation of that embodiment, for enabling a three pass configuration, the chamber (for example, a cubic-shaped chamber) has three pairs of respective opposite ends adjacent to respective opposite side facets of pairs of opposite side facets of the host substrate, so that multiple optical access along three respective transversal dimensions of the chamber is enabled for three respective light beams, each entering the chamber through one of the opposite ends of a respective pair and exits the same through the other of said opposite ends.

For an embodiment, the reservoir and the chamber further contain a buffer gas and/or are internally treated with the addition of a diffusion barrier to prevent atomic depolarizing collisions. This treatment is, for an implementation of that embodiment, a deposition of nanolayers (one or more layers with a thickness of tens of nanometers) of a non-depolarizing material, like aluminum oxide, onto the non-buried laser written chambers.

For some embodiments, the atomic vapor cell comprises a plurality of planar or three-dimensional chambers, fabricated like the one described above, with the same or a different shape (elongate shape, prismatic shape, etc.), and/or one or more buried or non-buried laser written chambers, where non-fluidically connected to each other, or some or all of them fluidically connected with each other, depending on the embodiment.

The present invention also relates, in a second aspect, to an integrated atomic/photonic device, comprising the atomic vapor cell of the first aspect and at least one further photonic component defined or arranged, i.e. integrated, on the host substrate or on a further host substrate.

According to an embodiment, the at least one further photonic component is either a planar or non-planar waveguide-based photonic component laser written in the host substrate or in the further host substrate, or placed in a slot laser written in the host substrate or in the further host substrate.

Depending in the embodiment, one or more of the following planar and/or non-planar waveguide-based photonic components are included in the integrated atomic/photonic device of the second aspect of the present invention: a linear waveguide, a waveplate waveguide, a beam splitter waveguide, and optical components like micro-lenses, e.g., GRIN (Gradient-Index) lenses, etc., or a combination thereof.

Notably, for a preferred embodiment, the same maskless laser writing technique used for laser writing the chamber(s) is used efficiently to laser write the further optical components, such as photonic waveguides, preferably in transparent materials, thus achieving to write atomic chambers, reservoir and photonic waveguides with 3D structuring versatility, in an integrated atomic/photonic chip.

In a third aspect, the present invention relates to an apparatus, comprising the atomic vapor cell of the first aspect and/or the integrated atomic/photonic device of the second aspect.

According to different embodiments, the apparatus is at least one of the following apparatuses: a system for saturated absorption spectroscopy (SAS), an atomic spectroscopy/frequency reference, an atomic clock, a single-beam or two beams optically-pumped-magnetometer, a magnetic microscope, a spin-based atomic sensor, and an atomic gyroscope.

For an embodiment, the apparatus of the third aspect of the present invention further comprises optical fibres joint/glued (i.e., not separated) to the vapor cell or to the atomic/photonic device so that laser light of one or multiple laser beams can input through at least one of said optical fibres, propagate through the chamber, and then output therefrom, after atomic interaction, though at least one other of said optical fibres.

The present invention also relates, in a fourth aspect, to a method for fabricating an atomic vapor cell, for atomic or molecular spectroscopy, optical pumping, and/or spin-based atomic sensing, comprising providing a host substrate and defining there within a chamber (or a plurality of chambers) for containing an atomic vapor, wherein the method comprises laser writing the chamber in the host substrate without the need of a mask or photoresist, in the form of a buried or non-buried chamber with either planar or three-dimensional chamber.

The method of the fourth aspect of the present invention is adapted, for an embodiment, to fabricate the atomic vapor cell of the first aspect of the present invention.

According to an embodiment, the method of the fourth aspect of the present invention further comprises:
  laser writing in the host substrate:
    a reservoir and connecting channels fluidically communicating the chamber with said reservoir, wherein the reservoir is in the form of a planar or three-dimensional reservoir and has at least one open end defined at a face of the host substrate, and/or
    one or more buried or non-buried chambers, reservoirs and/or connecting channels on a top or bottom surface of the host substrate;

removing excess material from the laser writing process of at least said buried chamber through said at least one open end of the reservoir and/or polishing the one or more non-buried chambers, reservoirs and/or connecting channels through an open end thereof;

filling the reservoir with said atomic vapor or with a source of material originating said atomic vapor;

adding a deposition of a diffusion barrier, i.e., a nanolayer of non-depolarizing material like aluminium oxide, to the inner walls of the chambers and/or filling the chambers with a buffer gas, to prevent atomic depolarizing collisions;

bonding a sealing substrate to said face of the host substrate to seal said at least one open end of the reservoir and/or bonding a sealing substrate on the top or bottom of the host substrate if one or more non-buried chambers, reservoirs and/or connecting channels have been laser written on the top or bottom surface of the host substrate; and diffusing the atomic vapor to reach the chamber.

For an alternative embodiment, the method of the fourth aspect of the present invention comprises providing the chamber with at least an inlet connection, and filling the same with the atomic vapor from the exterior of the atomic vapor cell, and, for a variant of that embodiment, also with an outlet connection, and making the atomic vapor enter the chamber through the input connection, flow through the chamber, and exit the chamber through the outlet connection.

The present invention has several applications, such as the ones listed below in a non-exclusive manner:

Custom-design of vapor cells for many industrial and scientific applications.

Atomic and molecular spectroscopy/Laser frequency stabilization.

Atomic clocks (with applications to space science/GPS, etc).

Optically pumped magnetometers/gradiometers (with applications to MEG/MCG/Neurotech/NMR/Chemical Analysis as well as geophysics and archaeology).

Atom optics applications that are not strictly sensing but require optical pumping, such as atomic quantum memories and nonlinear atom-optics processes.

Atomic gyroscopes (with applications to car industry, space science and magnetic navigation).

Magnetic microscopy, with applications to biology, materials and chemicals, for magnetic characterization with sub-mm spatial resolution as well as magnetic measurements in magneto-physiology (muscle-on-chip) and neurophotonics.

The maskless fabrication technique used in the present invention, for all its four aspects, provides several advantages. Laser writing inside the host material enables the fabrication of geometries with 3D structuring versatility. For example, a reservoir can be written at a different depth with respect to the physics chamber, a feature that is not possible to realize with conventional mask fabrication techniques. Furthermore, multiple physics chambers can be written at different depths to enable differential measurements between different atomic sensing regions in space, e.g. a first order or multi-order atomic gradiometer. Additionally, since the maskless laser writing, for example by a femtosecond laser, is for some preferred embodiments performed in transparent materials such as fused silica, multiple optical access to the physics chambers from 3 axes is possible. In contrast, microfabricated cells (e.g. MEMS cells) as those described in the prior art, use a middle wafer which is usually not transparent (often made of Silicon) to atom resonant wavelengths, such as rubidium or cesium wavelengths. State-of-the-art microfabricated cells have limited optical access along one axis, 1D access.

BRIEF DESCRIPTION OF THE FIGURES

In the following some preferred embodiments of the invention will be described with reference to the enclosed figures. They are provided only for illustration purposes without however limiting the scope of the invention. In accordance with common practice, the components in the figures are drawn to emphasize specific features and they are not drawn to the right scale.

DETAILED DESCRIPTION

Figure 1:
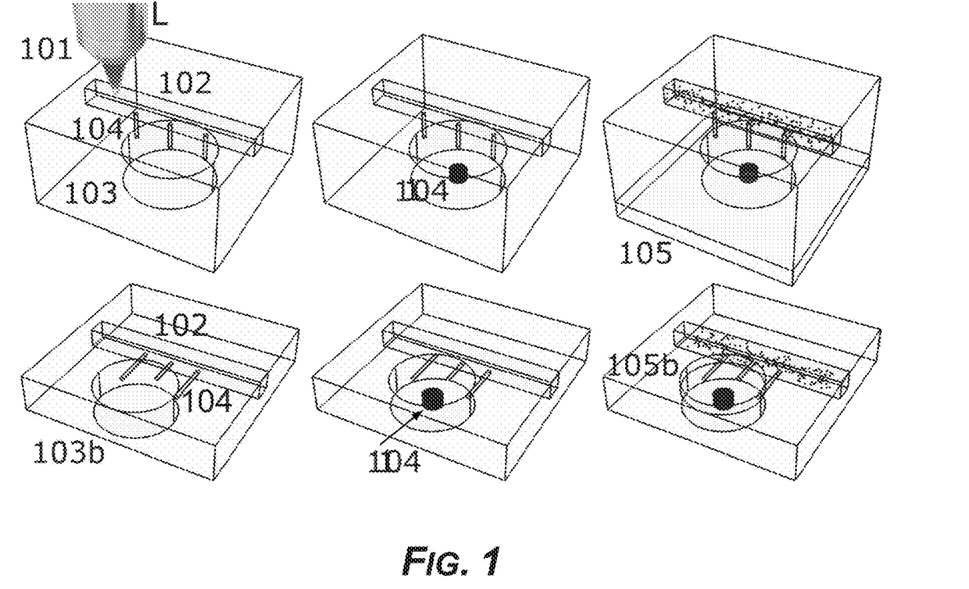
FIG. 1 schematically illustrates the atomic vapor cell of the first aspect of the present invention, also called below as LWVC (Laser-Written Vapor-Cell) along different building blocks or stages of its fabrication according to the method of the fourth aspect, for two embodiments.

FIG. 1 illustrates the design of the atomic vapor cell of the first aspect of the present invention, i.e., a laser-written-vapor-cell (LWAVC) and its comprised components, along different building blocks or stages of its fabrication according to the method of the fourth aspect, for two different embodiments: an embodiment represented by the three top views and another embodiment represented by the three bottom views.

As shown in the figure, for both embodiments, the atomic vapor cell comprises a chamber 102, a reservoir 103 and connecting channels 104 which are directly-written by laser-irradiation (with laser source L, represented in the left-top view) on a solid host material or substrate 101 in a non-planar geometry. The chamber 102, the reservoir 103 and the connecting channels 104 are empty since the substrate material is removed in a second step after irradiation, for example through immersion in a chemical etchant solution.

According to definition of the expression "planar chamber" or "chamber with a planar geometry" provided in a previous section of this document, the laser-written chamber 102 in FIG. 1 is a "planar chamber".

However, according to definition of the expressions "three-dimensional chamber" or "non-planar geometry" provided in a previous section in this document, the void geometry combining chamber 102 with reservoir 103 and connecting channels 104 (see FIG. 1) is a "three-dimensional chamber" with "non-planar geometry". These buried volumes with arbitrary 3D shapes can be laser written, for example by a femtosecond laser, inside the host material, without the need for a mask or photoresist.

The solid host substrate 101 is made of a transparent material like fused silica or borofloat in a preferred embodiment, but it is made of a different material, such as silicon nitride, ceramics, crystals, and polymers, in other embodiments. While, for the illustrated embodiments, the chamber 102 and the connecting channels 104 are completely buried within the host material, the reservoir 103 reaches an open facet or open end, in order to remove material, e.g., with a chemical etchant, and to fill the cell. For the embodiment of the top three views of FIG. 1, the open end of the reservoir 103 is located at the bottom face of the host substrate 104, while for the embodiment of the three bottom views of FIG. 1, the open end of the reservoir 103b is located at the top face of the host substrate 104, where the terms "bottom" and "top" have been used referring to the depicted positions, but they could, for example, be substituted by "top" and "bottom", respectively, if the cell was depicted upside down.

In one embodiment, such as that of the three top views of FIG. 1, the reservoir 103 is at a different depth with respect to the chamber 102, while, for another embodiment, such as that of the three bottom views of FIG. 1, the reservoir 103b is at a side of the chamber 102.

In an embodiment, not shown in the figures, chamber 102, connecting channels 104 and reservoir 103 are laser written in a planar non-buried configuration on the top surface of the solid host substrate 101.

The cell is then filled with a source of evaporable material 1104 that is a solid state dispenser in one embodiment, a liquid solution containing alkali metal, e.g., alkali-metal azide in another embodiment, and pure alkali metal in another embodiment. Particularly, for the two embodiments shown in FIG. 1, the reservoir 103, 103b is filled with the evaporable material 1104 through its respective open end, and the evaporable material 1104 reaches the chamber 102 by diffusion, as shown by the cloud of points represented in the right, top and bottom, views of FIG. 1.

After filling, the host substrate 104 is then bonded with a sealing substrate 105, 105b, of the same material of the host substrate 104 or of a different material, depending on the embodiment, to close the reservoir 103, 103b from the bottom with sealing substrate 105 or from the top with sealing substrate 105b of the cell, where, as mentioned above, "bottom" and "top" refer to the depicted positions.

For the illustrated embodiments, sealing substrate 105 covers the whole bottom face of the host substrate 104, while sealing substrate 105b is disc-shaped and covers only the open end of the reservoir 103b. For modifications of those embodiments, any of those sealing substrates 105, 105b has a different shape than that illustrated and/or cover only the open end of the reservoir 103, 103b, or partly or completely the face of the host substrate 104 reached by that open end.

In one embodiment the bonding of the sealing substrate 105, 105b occurs with UV curing glue, while in another embodiment the bonding consists in glass-to-glass bonding, e.g., optical contact bonding, or glass-silicon-glass bonding.

The evaporable material or compound 1104 contains alkali metals like rubidium, cesium, or potassium, in natural abundance, in an embodiment, or pure isotopes in another embodiment. These are released with an activation process after bonding, like UV reaction in one embodiment, or laser activation in another embodiment.

For some embodiments, the filling of the dispenser 1104 occurs in vacuum chambers or with addition of noble gases as buffer gas (with pressures higher than 100 Torr) to prevent atomic depolarizing collisions, like nitrogen in one embodiment or mixture of nitrogen and argon in another embodiment, or other noble gases like $^{3}$He and $^{129}$Xe in another embodiment, depending on the sensing and spectroscopy application.

For an embodiment, there is not a reservoir, but the atomic vapor or compound continuously diffuses through inlet and outlet connections, like in lab-on-chip microfluidics, into the written chamber(s) 102, which are heated at temperature above 80 C.

In a further embodiment, the reservoir 103, 103b is connected to a glass system and filled with glassblowing techniques before sealing.

Figure 2:
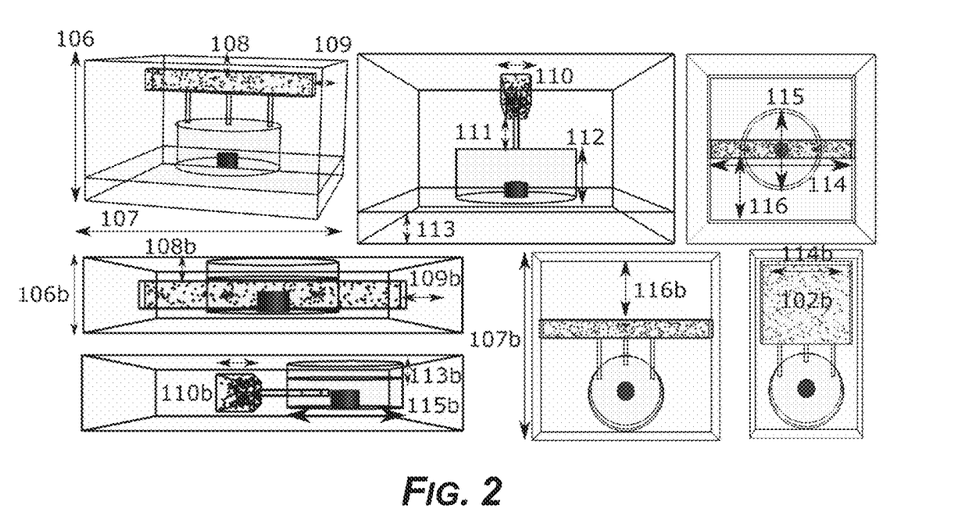
FIG. 2 shows different views of the LWVC of the present invention, illustrating LWVCs exemplary dimensions, for different embodiments.

In FIG. 2, different views of the LWVC of the present invention are shown, illustrating LVWCs exemplary dimensions, for different embodiments. Particularly, an embodiment is represented by the three top views of the figure, another embodiment by the two left, middle and bottom, views of the figure, and two further embodiments by the middle and right bottom views of the figure.

The direct laser-writing has 3D versatility so the chamber/channel 102 is, for an embodiment, buried within the host at depth 108/108b, i.e., distanced from the top facet of the host material substrate 101 (according to the depicted position), ranging from mm down to ten nanometres, depending on the application. For example, if a sample is placed on the top of the cell, the depth 108, 108b is, for an embodiment, the stand-off distance of the atomic sensor from a sample and it is, for an embodiment, reduced down to the nanometre scale. If laser light propagates along the chamber/channel 102, the distance from the cell wall 109/109b is, for an embodiment, minimized to reduce optical losses.

The side facets are, for an embodiment, further polished to minimize transmission losses. The reservoir 103/103b can have a diameter 115, 115b as small as the evaporable source, and a height 112 as short as the same. For example, commercial alkali metal dispensers (SAES Getters) have a diameter of 1 mm and thickness of 600 micron. However, micron-sized dispensers are, for an embodiment, produced so that the reservoir 103, 103b can have accordingly micron-sized diameter and height.

Each of the outer dimensions 106, 107 of the host substrate 101 can vary from 1 cm in one embodiment to sub-mm size in another embodiment, depending on the application. The sealing substrate 105/105b can also have a thickness 113, 113b ranging from a few mm (where "few" means at least 2) down to tens or hundreds micron. The connecting channels 104 can have a cross section down to tens of micron and variable length 111 and shape to connect reservoir 103, 103b and chamber 102.

The chamber 102 is a squared or cylindrical channel in two different embodiments, although any other kind of non-planar shape is also possible, for other embodiments. Its cross section 110, 110b is 1 mm×1 mm in one embodiment or having sub-mm dimension in another embodiment, e.g., 100 micron×100 micron, where chamber(s) 102 are then microchannels.

In another embodiment, the chamber 102b is a cubic or cylindrical cavity with width 114b and thickness of few mm (where "few" means at least 1 mm), similarly to MEMS cells, to increase the atomic interaction volume and to reduce depolarizing collisions by the walls.

A laser beam can then be collimated or focused into the microchannel/chamber 102, 102b, depending on its size and length. The length 114 is 1 cm in one preferred embodiment, but the length 114b is reduced to a mm side in another embodiment.

In another embodiment with two or three optical accesses to the atomic interaction area, the physics chamber, i.e., the chamber 102, can actually be squared or cubic depending on double or triple optical access (not shown). The distance between the chamber 102 and the host side facet 116/116b, as well as the outer host substrate's dimension 107 and 107b is, for an embodiment, reduced to match reservoir 103, 103b and chamber 102, 102b dimensions to minimize the host substrate 101 total volume.

Figure 3:
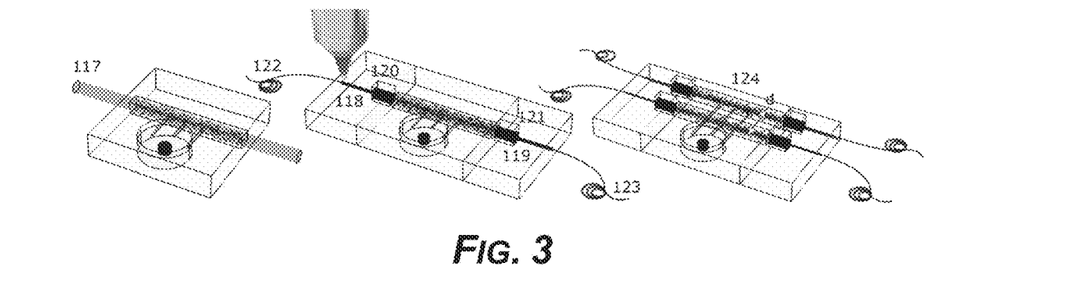
FIG. 3 schematically illustrates the device of the second aspect of the present invention, for different embodiments, for free space probing and integration of LWVCs with photonic waveguides, collimation optical components and fibres.

FIG. 3 schematically illustrates the device of the second aspect of the present invention, also called below LAVC device, for different embodiments, for free space probing and integration of LWVCs with photonic waveguides, optical components, fibres and, more generally, with any waveguide-based photonic structure in non-planar geometry.

The LWVC is, for an embodiment, used with laser light in free space, as shown in the left view of FIG. 3 where a laser beam 117 propagates along the channel/chamber 102 in the LAWVC.

The LAVC can otherwise be integrated with photonic waveguides 118 and 119 laser-written with the same technique on a separated host material in one embodiment, and in the same host substrate 101 of the LWVC in another embodiment. The input laser-written waveguide 118 is, for an embodiment, a polarization rotator that can polarize the input light beam circularly or linearly.

In an embodiment, the waveguide output directly propagates through the chamber 102 of the LWVC. In a preferred embodiment, the mode of the input waveguide 118 is, for an embodiment, expanded and collimated through an optical element 120 to the physics channel or chamber 102.

The optical element 120 is, for an embodiment, for example, a GRIN lens bonded or placed in an appropriate laser-written empty slot in one embodiment. In another embodiment it is an integrated optical element, like an apodized grating structure that can expand the sub-micron optical mode of the input waveguide to a collimated beam with larger width from tens of micron to few mm (where "few" means at least 1 mm), in order to obtain an interaction volume, suitable for precision atomic spectroscopy and sensing.

After atomic interaction, laser output is refocused into an output waveguide 119 through a second integrated element 121 included in the device of the second aspect of the present invention, for the embodiment illustrated in FIG. 3, middle view.

The input and output optical waveguides 118/119 are connected to optical fibres 122/123 to couple light from external sources into the LWVC device, for the embodiment illustrated in FIG. 3, middle view.

Polarization is also controlled before the input fibre 122 in another embodiment. In a further embodiment, optical fibres are connected to the input/output waveguides, while in one other embodiment the fibres 122/123 are connected or glued directly to the corresponding optical element 120/121.

Other optical components, like polarizers, half and quarter waveplates, interference filters, dichroic or total reflection mirrors are integrated into device, for some embodiments. In this way the desired polarization is, for an embodiment, generated in the integrated device, depending on the particular application.

The fibres are single-mode in an embodiment or multi-mode in another embodiment. In an embodiment, for instance for the saturated-absorption-spectroscopy application, the output fibre 123 is a fiberized mirror that reflects light back after atomic interaction, so that light is coupled back into the same input fibre 122 after double pass atomic interaction.

In a gradiometer configuration, for the embodiment illustrated in FIG. 3, right view, at least a second parallel sensing channel/chamber 124 is laser-written with distance (d), which is the gradiometer baseline, from the other sensing channel/chamber 102. This baseline can vary between ten micron in an embodiment to cm in another embodiment. Microchannels 104 connect the reservoir 103 and the two or multiple chambers 102. Light is, for an embodiment, coupled through input fibres into waveguides and the optical mode expanded, and collimated by an element like 118. The gradiometer mode is meant to have, in addition, a copy of the same optical arrangement, including waveguides 118/119, optical elements 120/121 and optical fibres 122/123.

Figure 4A:
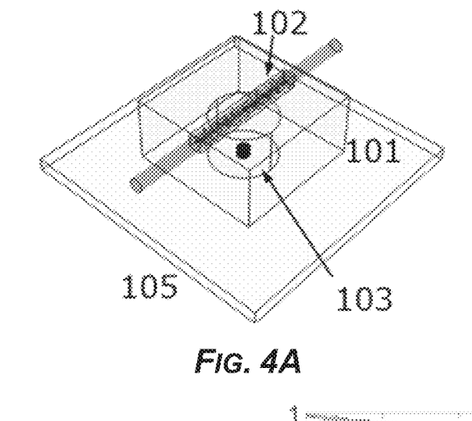
FIGS. 4A to 4C illustrate, for an embodiment, an experimental setup of the LWVC of the present invention, shown in FIG. 4A (schematic representation), and two plots shown characteristic absorption spectra (FIG. 4B) and transmission (FIG. 4C) of rubidium from the LVWC probed in free space.
Figure 4B:
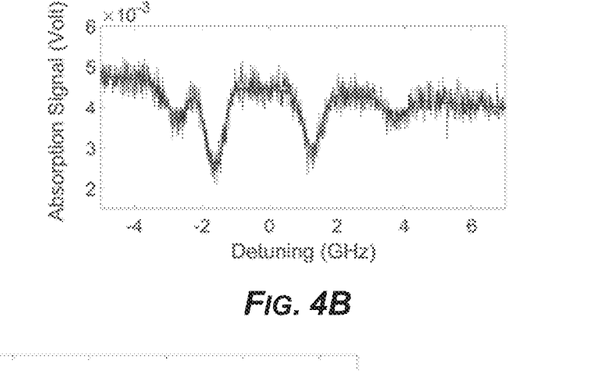
Figure 4C:
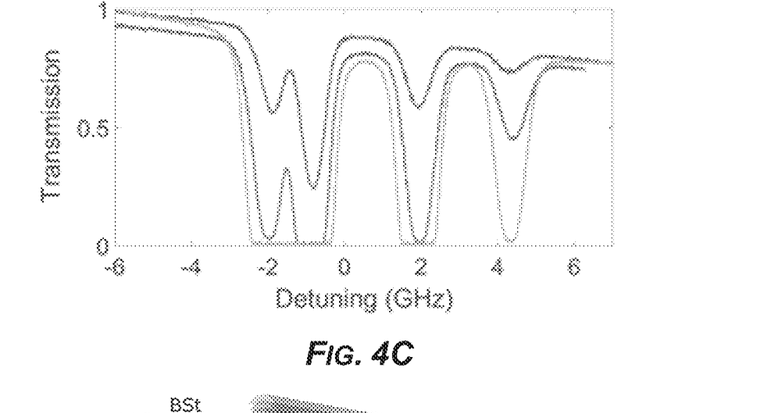

FIGS. 4A to 4C illustrate, for an embodiment, an experimental setup of the LWVC of the present invention.

Specifically, FIG. 4A is a 3D sketch of the LWVC used for the experiment, which has been filled with a solid-state Rb dispenser (SAES getters) and the host substrate 101 bonded to a sealing substrate 105 with UV curing glue, with the LWVC showing the channel/chamber 102 and reservoir 103 and also the bonded thin sealing substrate 105.

FIG. 4B shows absorption spectrum in the weak-probe limit and FIG. 4C normalized absorption spectra (transmission) at temperatures of T=60° C. (top waveform), T=70° C. (middle waveform) and T=80° C. (bottom waveform). The spectrum of FIG. 4B is fitted with a Voigt profile and a pressure-induced broadening of about 70 MHz is obtained, corresponding to a N2 residual pressure of 3.5 Torr. This experimental condition, where buffer-gas broadening is between the 6 MHz natural linewidth and the 500 MHz Doppler broadening, is suitable to test the LWVC device for sub-Doppler saturated spectroscopy and for atomic sensing based on atomic coherence time like optical magnetometry.

Different applications of the present invention are described below, for different embodiments embodying different apparatuses, with reference to FIGS. 5 to 11.

Figure 5:
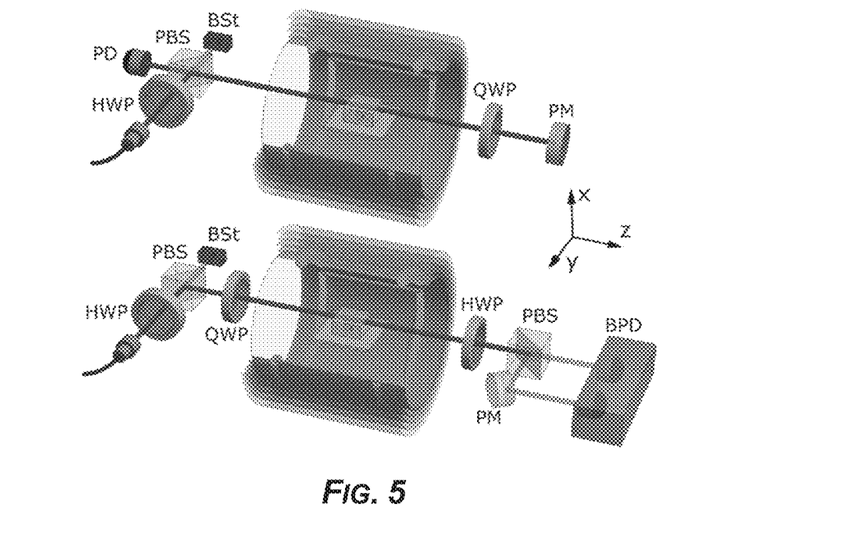
FIG. 5 illustrates an experimental setup for saturation-absorption-spectroscopy (SAS) and single beam magnetometry with the LWVC of the present invention, for an embodiment of the LVWC, device, and apparatus of the present invention, and free space laser.

Experimental Setup for SAS and Single-Beam Optical Magnetometer with a LWVC:

FIG. 5 illustrates an experimental apparatus to perform either saturated absorption spectroscopy (SAS) (top view), suitable for laser frequency stabilization, or single-beam optical magnetometry (bottom view). The LWVC is enclosed in a magneto-optical setup, which consists of a single layer of magnetic shielding and coils to generate dc and gradient fields. A ceramic oven surrounds the LWVC and is heated trough flexible Kapton heaters, while the temperature is stabilized within 0.1 C through a thermocouple sensor and a temperature controller. A laser beam is fibre coupled and the power is adjusted through a half-waveplate and a polarizing beam splitter, which also ensures linear polarization of the reflected beam reaching the LVVVC for atomic interaction. For saturated absorption spectroscopy (SAS) and optical magnetometry measurements, the optical components depicted in FIG. 5 and described below are used.

Specifically, the LV/C stands within a layer of μ-metal shielding and a system of concentric coils. The laser beam is coupled to a fibre collimator, the power reaching the LWVC is adjusted with a half-wave-plate HWP and a polarizing beam-splitter PBS, while the residual power is absorbed by a beam stop BSt.

The SAS setup (top view) is a double-pass configuration including a quarter-wave-plate QWP after atomic interaction, a fully reflecting planar mirror PM and a photo-detector PD after double-pass through the LWVC.

The optical magnetometer setup (bottom view) is a single-pass configuration including a QWP before atomic interaction and a polarimeter, which consists of HWP, PBS, PM and an amplified differential photo-detector (BPD).

Saturation Absorption Spectroscopy (SAS) with a LWVC:

As shown in FIG. 5, top view, SAS is performed by sending 1 mW of a linearly-polarized 795 nm laser beam (Toptica DL100), tuneable around the Rb D1 transition, through the laser-written channel/chamber 102, retro-reflecting with a planar mirror PM, and detecting the transmitted light with a 150 MHz amplified photodetector PD. A quarter-wave plate QWP before the mirror PM flips the polarization between the two passes. The laser current is modulated at 20 MHz to produce frequency modulation (FM) of the probe, and the detected photocurrent is demodulated to recover an error signal proportional to the derivative with respect to frequency of the transmission. The same technique is simultaneously applied, with the same laser power, to obtain the error signal from a commercial Rb cell with no buffer gas and a 71.8 mm internal length (not shown in FIG. 5).

Figure 6:
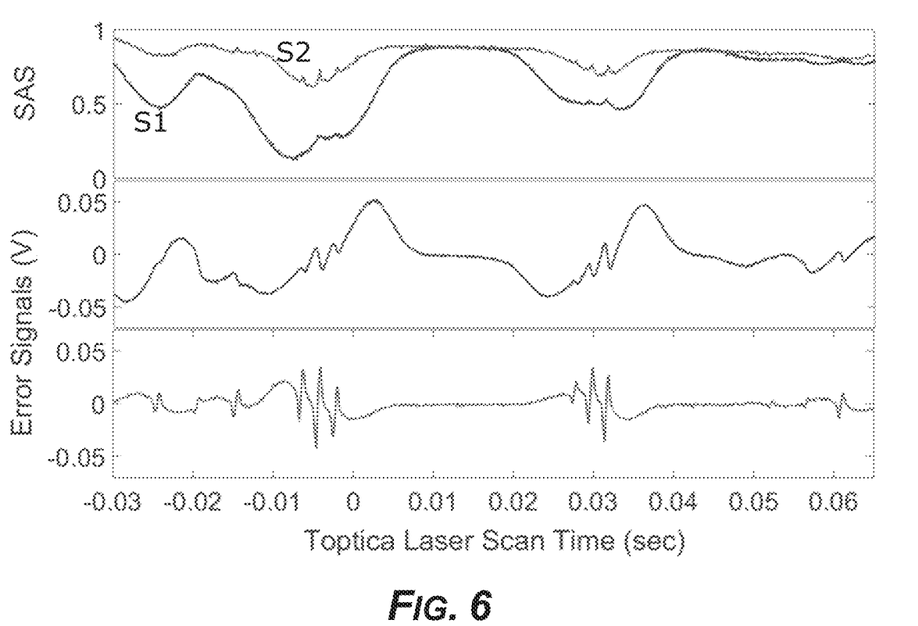
FIG. 6 plots experimental SAS from a LVWC and a reference cell. Top: D1 Line Rubidium saturated-absorption-spectra for the LWVC (S1) and the vapor reference cell (S2). Middle: error signal for RF spectroscopy with the LWVC at 70° C. Bottom: error signal for RF spectroscopy with the table-top vapor reference cell at room temperature.

FIG. 6 shows SAS spectra for both the LWAVC and the conventional reference cell. These resolve all sub-Doppler and crossover resonances for both 85Rb and 87Rb isotopes. With the LWVC stabilized at 70° C., a signal-to-noise ratio (SNR) comparable to that obtained with the conventional cell at room temperature is obtained. The inventors noted that the SAS features (the narrow absorption dips) are, due to pressure broadening, about ten times broader than the natural linewidth. A lower buffer gas pressure, either by sealing in vacuum or by further gettering by the dispenser material, is, for an embodiment, expected to reduce this width and give a corresponding boost in SNR.

Zero-Field Magnetic Resonances with a LWVC:

To demonstrate the potential of LVWCs for application to quantum sensors based on atomic coherence, the present inventors performed measurements of zero-field magnetic resonance (ZFR) using an elliptically polarized single beam. The experimental setup is shown in the bottom view of FIG. 5. The laser beam is partially circularly polarized by a quarter-wave-plate QWV so that the atomic ensemble is optically-pumped with a non-zero electron spin polarization $P_Z$ along the z-axis. Then, in the presence of a dc magnetic field applied in the transverse direction $B_X$, the linearly polarized component of the same beam undergoes paramagnetic Faraday self-rotation, which is detected by a polarimeter, consisting of a half-wave-plate HWP, a PBS and a differential photo-detector BPD with switchable gain (Thorlabs PDB450A). For the magnetometry measurements, different DFB lasers were used at either 795 nm or 780 nm, tuned near the central D1 or D2 lines of 85Rb, respectively.

Figure 7A:
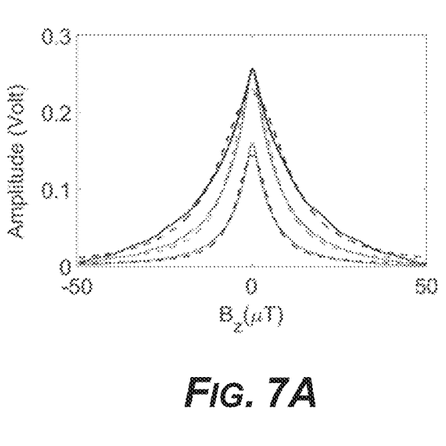
FIGS. 7A and 7B respectively illustrate, plotted in two diagrams with different amplitude ranges, zero-field magnetic resonance obtained from the LWVC of the present invention, for an embodiment.
Figure 7B:
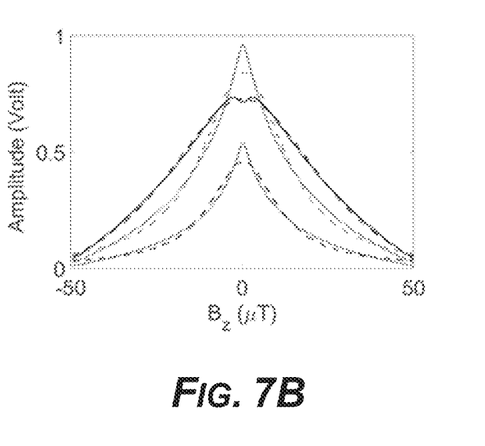

FIGS. 7A and 7B show zero-field magnetic resonances for the D1 and D2 Rb lines when the transverse magnetic field $B_X$ is scanned over a range of about 100 μT. These experimental resonances demonstrate that optical pumping is, for an embodiment, performed in the laser-written atomic vapor cells (LWVCs) of the present invention, and that atomic sensors based on atomic spin coherence is, for an embodiment, realized with this manufacturing technique. Specifically, FIGS. 7A and 7B show rotation signals versus transverse field for D2 and D1 lines, respectively, acquired with 3.5 mW of probe power. Solid lines show experimental data, dashed lines show prediction of Eq. (1) explained below. Bottom, middle and top lines show rubidium number density $n=(0.74, 1.0, 1.5) \times 10^{12}$, respectively, corresponding to cell temperatures of T=(70, 75, 80) C, respectively.

The physics explaining zero-field magnetic resonances, using a near-resonance single beam with elliptical polarization, is described in V. Shah et al, "Spin-exchange relaxation-free magnetometry using elliptically polarized light," Phys. Rev. A 80, 013416 (2009). The detected differential signal is:

$$V_{diff} = V_0 \sin \phi \cos 2\theta, \quad (1)$$

where $V_0$ is the signal amplitude (in Volt), $\phi\partial < P_Z$ is the rotation angle, θ is the angle of the quarter-waveplate optic axis, relative to the initial linear polarization. In the here disclosed experiment θ=π/8 was fixed as optimal trade-off between pumping and probing.

The equilibrium spin polarization is:

$$P_z = \frac{P_z^0 \Delta B_x^2}{B_x^2 + \Delta B_x^2} \quad (2)$$

A Lorentzian function of the transverse magnetic field $B_X$ with half-width-half-maximum (HWHM) given by $\Delta B_x = \Gamma/\gamma$, where the full relaxation rate $\Gamma = 1/\tau$ is the inverse of the spin coherence time τ. By combining Eqs. (1) and (2) one can explain the line shape of the zero-field resonances shown in FIGS. 7A and 7B.

Atomic spectroscopy/frequency reference:

The LWVC of the present invention is, for an embodiment, used either with laser optics in free space, as described above, or integrated into the integrated atomic/photonic device of the second aspect of the invention, as described above, for several applications in atomic and molecular spectroscopy as well as for atomic quantum sensing. The integration with optical waveguides and fibres can enable a plug-and-play operation of the disclosed LWVCs.

Figure 8:
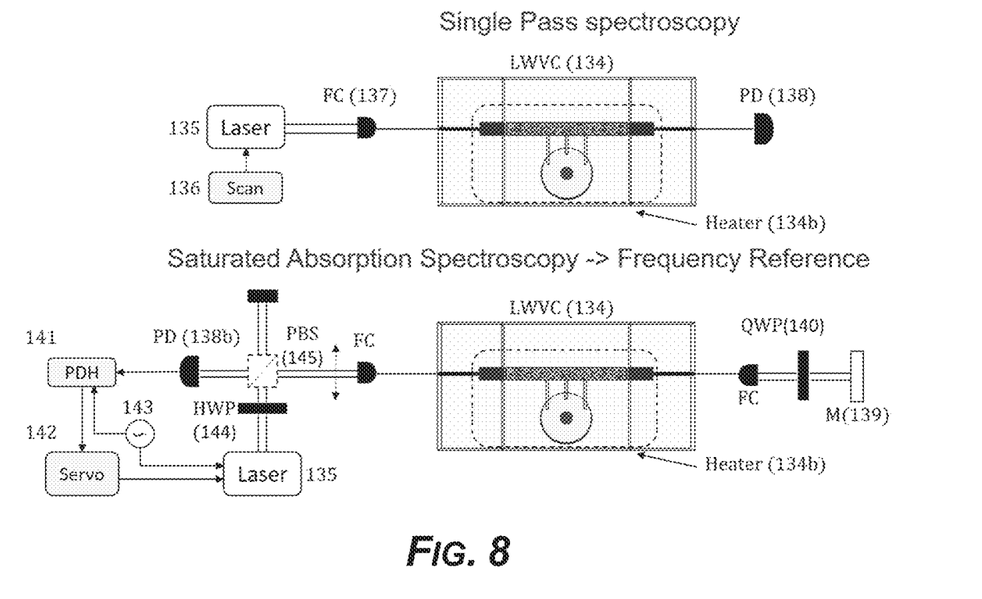
FIG. 8 schematically illustrates, by means of two respective schematic arrangements, an application of integrated LWVC for chip-scale atomic spectroscopy and frequency reference, for two respective embodiments of the LWVC, device, and apparatus of the first, second and third aspects of the present invention.

FIG. 8, top view, depicts a typical spectroscopy application where light from a laser source 135, near resonant with the atomic or molecular compound 104 in the reservoir 103 of the LWVC 134, is fibre coupled 137, propagates through the LWVC and it is detected with a photodetector 138 after atomic or molecular interaction. The LWVC device is heated with a heater element 134b to reach the desired density of the evaporable source 104. The heater 134b is, for an embodiment, a Kapton adhesive underneath the LWVC in one embodiment, a bonded resistive serpentine in another embodiment or a transparent ITO heater in yet another embodiment, where it could be used to close bond the reservoir 103 too. In another embodiment the LWVC is, for an embodiment, heated by hot air or with fiberized light heaters. If the laser source is scanned with an appropriate modulation controller 136, an absorption spectrum is detected at 138. In another embodiment light can propagate in free space through the laser-written atomic/molecular channel/interaction area.

In the bottom view of FIG. 8 a different application is shown, particularly an application of the LVWC device for laser frequency stabilization. To get a saturated absorption spectroscopy signal, the transmitted beam is reflected back with a planar mirror 139 and does not change its polarization by double pass in a quarter-wave-plate (QWP) 140, as described in the SAS experiments described above. Light is coupled back into the LVVVC after reflection and, after double pass through the LWVC, is detected with a photodiode 138b. The laser 135 current or phase is, for an embodiment, modulated with a local oscillator 143 so that the saturated-absorption-spectroscopy signal is, for an embodiment, demodulated at the same frequency to get an error signal, e.g., with a Pound-Drever-Hall (PDH) circuit 141 and a Servo system 142 is used to give feedback to the laser 135 to stabilize its frequency. The laser power is, for an embodiment, adjusted with a half-waveplate 144 and a polarizing beam splitter 145. In another embodiment, the reflection mirror 139 is fiberized and the QWP 140 integrated in the device. In another embodiment, anti-reflection coating is applied to one side of the LWVC to reflect back the transmitted light.

Figure 9:
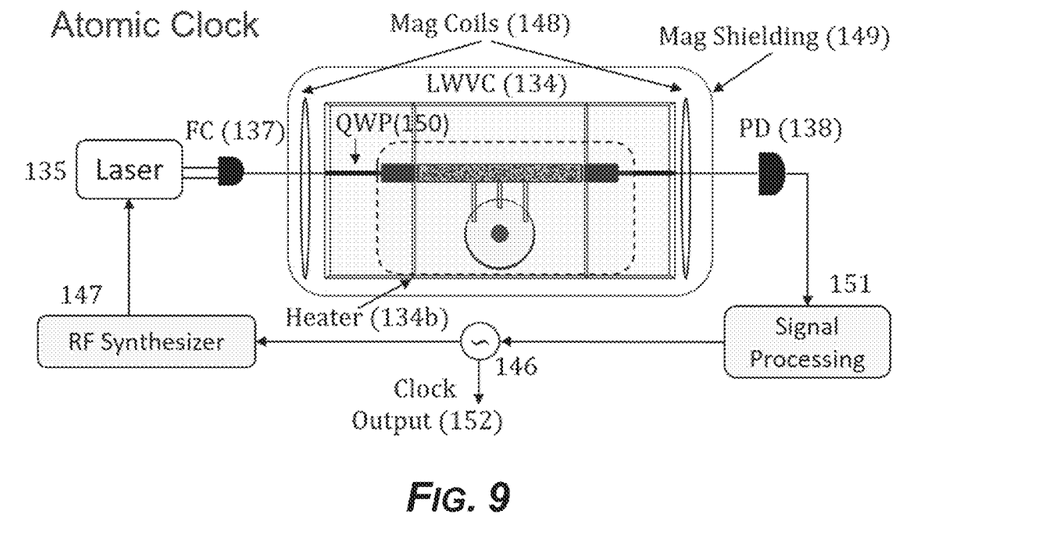
FIG. 9 illustrates a schematic arrangement for an application of integrated LVVC for chip-scale atomic clock, for an embodiment of the LWVC, device, and apparatus of the first, second and third aspects of the present invention.

Atomic Clock:

FIG. 9 depicts an application of a LVWC 134 for a chip-scale atomic clock. In this embodiment a coherence population trapping (CPT) atomic clock is shown. The frequency of a laser source 135 is modulated with a RF Synthesizer 147 at frequency given by a main local oscillator 146. A longitudinal magnetic field is generated with magnetic coils 148 and the system is enclosed in a magnetic shielding 149. Laser light is fibre coupled (FC 137) into the waveguide written in the LWVC and the optical mode is expanded and collimated with elements 118 and 120, as described above with reference to FIG. 3.

The laser light is, for an embodiment, circularly polarized before the fibre or the waveguide 118, for example with a polarization rotator, a quarter waveplate 150 for the illustrated embodiment, or another polarization element for another embodiment (not shown).

When the modulation frequency is equal to half of the ground state hyperfine frequency difference, of the atomic species in the LWVC, a coherent superposition of the two hyperfine ground states that does not absorb the pump light anymore, i.e., a dark state, is generated.

When the frequency is changed around this frequency, a CPT resonance is detected in transmission on a photodiode 138 and the signal is processed at 151 to lock the frequency on resonance and to give an atomic clock output 152. The LWVC device is, for an embodiment, heated with a heater element 134b to reach the desired density of the atomic ensemble/compound.

In another embodiment, not shown, a microwave cavity generates the atomic coherence instead of laser modulation.

In a further embodiment, not shown, light can propagate in free space through the laser-written chambers.

Figure 10:
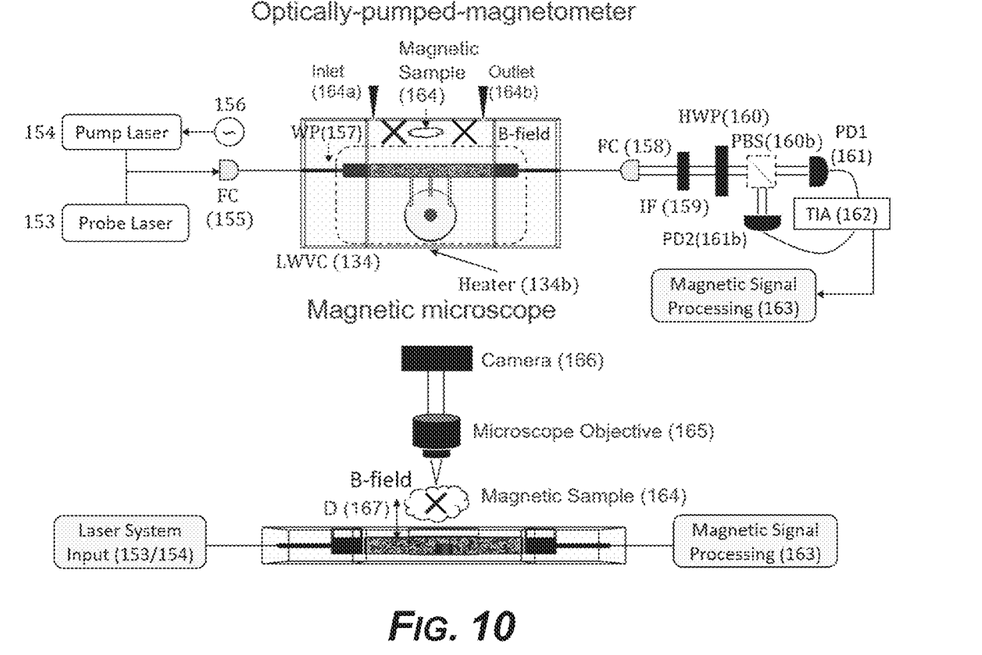
FIG. 10 illustrates a schematic arrangement for an application of integrated LWVC for chip-scale optical magnetometry (top view) and atomic magnetic microscopy (bottom view), for some embodiments of the LWAVC, device, and apparatus of the first, second and third aspects of the present invention.

Optically-Pumped-Magnetometer and Magnetic Microscope:

FIG. 10, top view, depicts the application of a LV % NC 134 for an optically-pumped-magnetometer (OPM), apart from the single beam scheme in free space, demonstrated above with reference to FIGS. 7A and 7B. Here a resonant pump laser 154 (modulated at frequency given by a local oscillator 156) and a near-resonance probe laser 153 are coupled into the same optical mode 155 and to the LWVC input waveguide. An integrated waveguide-based element 118/157, e.g., a multi-order waveplate, circularly polarize the pump beam while keeping linearly polarized the probe beam light. The LWVC device is heated with a heater element 134b to reach the desired density of the atomic ensemble/compound 104. Atomic polarization is generated in the LWVC sensing channel/chamber 102 by optical pumping.

In the presence of a transverse magnetic field B, to be measured, the atomic spins precess at Larmor frequency. This precession translates into paramagnetic Faraday rotation for the probe light, whose output is fiber coupled (158), spectrally filtered to block the pump light by an interference filter (159) and detected through a balanced polarimeter, which consists of a half-waveplate 160, a polarizing beam splitter 160b, two photodiodes 161/161b and a transimpedance amplifier 162. The differential rotation signal is processed with a data acquisition system (magnetic signal processing unit 163) and the Larmor frequency is extracted to give the magnetic field magnitude.

In an embodiment, the magnetic signal processing consists in frequency counters that do not need calibration. In another embodiment, a cross configuration with pump and probe beam mutually orthogonal are used, with a LWVC described in FIG. 11 below. In yet another embodiment, one pump beam and two probe beams interact with the same laser-written interaction area to give a vector magnetometer. In another embodiment, three LWVCs are combined with orthogonal channels orientation, to give a 3-axis vector magnetometer. In a further embodiment, a magnetic sample is placed on the top facet of the LWVC 134. In another embodiment, the magnetic sample 164 is placed in a microfluidic channel with inlet 164a and outlet 164b within the same material hosting the LWVC. This sample is, for an embodiment, a biological, liquid or an organ-on-chip that generates electromagnetic signals.

One particular application of OPMs using LWVCs and microchannels is the magnetic microscope depicted in the bottom view FIG. 10. Here, the magnetic sample 164, that is, for an embodiment, biological or a material, is placed at stand-off distance D 167 from the laser-written microchannels, i.e., from the chamber(s) 102. D can go down to nanometre scale, so that the atomic sensor gets very close to the sample 164. While the LWVC is used as an OPM, to give information about the magnetic field with sub-mm spatial resolution at 163 (as explained above with reference to the top view of FIG. 10), microscopy 165 or imaging 166 information is, for an embodiment, obtained from the top of the sample 164. An array of LWVCs can also be used for magnetic imaging. In another embodiment, light can propagate in free space through the laser-written chambers 102.

Figure 11:
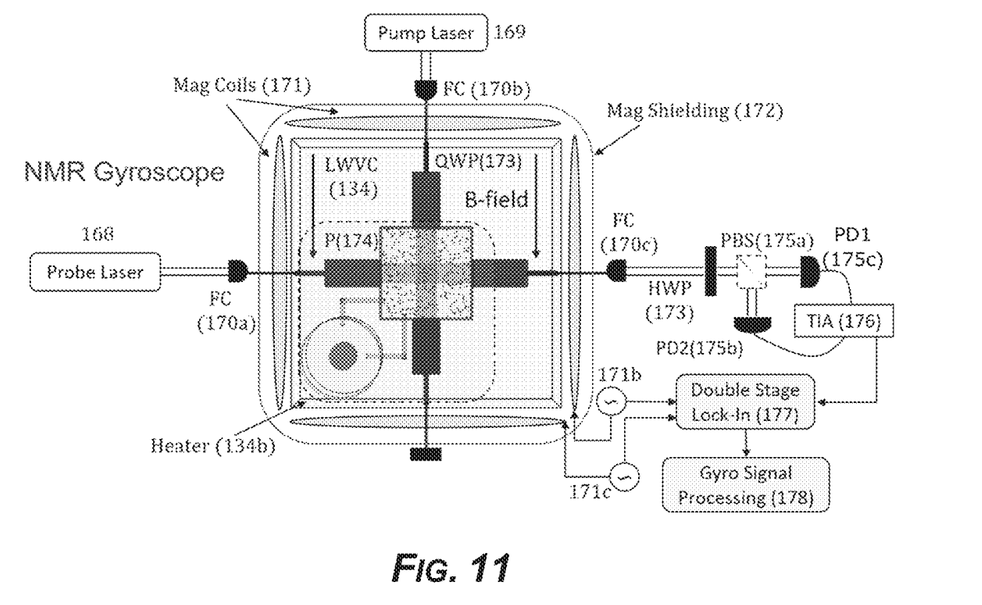
FIG. 11 illustrates a schematic arrangement for an application of integrated LWVC for on-chip atomic gyroscope, for an embodiment of the LVNC, device, and apparatus of the first, second and third aspects of the present invention.

Atomic Gyroscope:

FIG. 11 depicts the application of LVNC for an atomic NMR gyroscope. In this application the LVWC 134 can contain alkali atoms and noble gases in an embodiment, and alkali isotopes and noble gases in another embodiment, i.e., in a comagnetometer scheme. The LWVC device is heated with a heater element 134b to reach the desired density of the atomic ensemble/compound 104. Atomic polarization of the alkali vapor is generated by a pump beam 169 which is fibre coupled 170b and circularly polarized by an integrated QWP 118/173. A noble gas with non-zero nuclear spins also gets polarized by spin-exchange collisions with the alkali atoms.

Both a static and an oscillating magnetic fields are generated by magnetic coils 171 and the system is enclosed in a magnetic shielding 172. The alkali spins precess about a total field, given by the sum of a static field $B_0$, and a field induced by the magnetization of the precessing nuclear spins of the noble gas, e.g., Xe. Longitudinal magnetic coils 171 drive the precession of the alkali atoms about the total field precession at much higher frequency.

A probe beam 168 is fibre coupled 170a to the LWVC input waveguide and monitors the precession of alkali atoms with a detection via balanced polarimetry, which consists of HWP 173, PBS 175a, photodiodes 175b/175c, after passing through fibre couple 170c. The differential signal, amplified by a TIA 176, has a double modulation at the high Larmor frequency of the alkali atoms and by the lower one of the noble gas.

When the apparatus is rotating about the applied scalar field $B_0$, the noble gas Larmor precession frequency is modified by the rotation rate $\Omega$, e.g., $\omega_{Xe} = \gamma_{Xe} B_0 + \Omega$, where $\gamma_{Xe}$ is the noble gas gyromagnetic ratio. Using a double stage phase-detection, e.g., demodulation or lock-in detection 177, the change in precession frequency, i.e., the gyro signal 178, is, for an embodiment, measured with high sensitivity. In another embodiment, light can propagate in free space through the laser-written chambers 102.

A person skilled in the art could introduce changes and modifications in the embodiments described without departing from the scope of the invention as it is defined in the attached claims.

What is claimed is:

1. An atomic vapor cell, for at least one of atomic or molecular spectroscopy, optical pumping, and spin-based atomic sensing, comprising a host substrate and defined there within a chamber for containing an atomic vapor, wherein said chamber is a buried or non-buried chamber laser written in said host substrate without the need of a mask or photoresist, with either planar or three-dimensional geometry.

2. The atomic vapor cell of claim 1, wherein the host substrate and chamber are configured and arranged to enable multiple optical access to an atomic interaction area of the chamber along at least two optical axes.

3. The atomic vapor cell of claim 1, further comprising, also laser written in the host substrate, a buried or non-buried reservoir and connecting channels fluidically communicating the chamber with said reservoir, wherein the reservoir is a is a planar or three-dimensional reservoir.

4. The atomic vapor cell of claim 3, wherein the reservoir has at least one open end defined at a face of the host substrate and the vapor cell further comprises a sealing substrate bonded to said face of the host substrate to seal said at least one open end, wherein said at least one open end was made to remove excess material from the laser writing process therethrough and to fill the reservoir with said atomic vapor or with a source of material originating said atomic vapor.

5. The atomic vapor cell of claim 1, wherein at least the host substrate is transparent to a determined wavelength of a light beam used for a single or multiple optical access to the chamber for performing at least one of said atomic or molecular spectroscopy, optical pumping, and spin-based atomic sensing.

6. The atomic vapor cell of claim 5, wherein the chamber has at least a pair of respective opposite ends adjacent to respective opposite side facets of the host substrate, so that optical access along one dimension of the chamber is enabled for a light beam entering the chamber through one of said opposite ends and exits the same through the other of said opposite ends.

7. The atomic vapor cell of claim 5, wherein the chamber has at least two pairs of respective opposite ends adjacent to respective opposite side facets of pairs of opposite side facets of the host substrate, so that multiple optical access along two respective transversal dimensions of the chamber is enabled for two respective light beams, each entering the chamber through one of the opposite ends of a respective pair and exits the same through the other of said opposite ends.

8. The atomic vapor cell of claim 1, wherein the reservoir and the chamber at least one of:
further contain a buffer gas, and
are internally treated with the addition of a diffusion barrier to prevent atomic depolarizing collisions.

9. An integrated atomic/photonic device, comprising the atomic vapor cell of claim 1 and at least one further photonic component defined or arranged on said host substrate or on a further host substrate.

10. The integrated atomic/photonic device of claim 9, wherein said at least one further photonic component is integrated on said host substrate or on said further host substrate.

11. The integrated atomic/photonic device of claim 9, wherein said at least one further photonic component is either a planar or non-planar waveguide-based photonic component laser written in said host substrate or in said further host substrate, or placed in a slot laser written in said host substrate or in said further host substrate.

12. The integrated atomic/photonic device of claim 10, wherein said at least one further photonic component is either a planar or non-planar waveguide-based photonic component laser written in said host substrate or in said further host substrate, or placed in a slot laser written in said host substrate or in said further host substrate.

13. An apparatus, comprising at least one of the atomic vapor cell of claim 1 and the integrated atomic/photonic device of claim 10.

14. The apparatus of claim 13, wherein the apparatus is at least one of the following apparatuses: a system for saturated absorption spectroscopy, an atomic spectroscopy/frequency reference, an atomic clock, an optically-pumped-magnetometer, a magnetic microscope, a spin-based atomic sensor, and an atomic gyroscope.

15. The apparatus of claim 13, further comprising optical fibres joint/glued to the vapor cell or to the atomic/photonic device so that laser light of one or multiple laser beams can input through at least one of said optical fibres, propagate through the chamber, and then output therefrom, after atomic interaction, though at least one other of said optical fibres.

16. A method for fabricating an atomic vapor cell, for at least one of atomic or molecular spectroscopy, optical pumping, and spin-based atomic sensing, comprising providing a host substrate and defining there within a chamber for containing an atomic vapor, wherein the method comprises laser writing the chamber in said host substrate without the need of a mask or photoresist, in the form of a buried a buried or non-buried chamber with either planar or three-dimensional chamber.

17. The method of claim 16, further comprising:
laser writing in the host substrate at least one of:
   a reservoir and connecting channels fluidically communicating the chamber with said reservoir, wherein the reservoir is in the form of a non-planar three-dimensional reservoir and has at least one open end defined at a face of the host substrate, and
   on a top or bottom surface of the host substrate, at least one of:
      one or more buried chambers,
      one or more non-buried chambers,
      reservoirs, and
      connecting channels;
at least one of:
   removing excess material from the laser writing process of at least said buried chamber through said at least one open end of the reservoir, and
   polishing the at least one of one or more non-buried chambers, reservoirs, and connecting channels through an open end thereof;
at least one of:
   adding a deposition of a diffusion barrier to the inner walls of the chambers, and
   filling the chambers with a buffer gas, to prevent atomic depolarizing collisions;
filling the reservoir with said atomic vapor or with a source of material originating said atomic vapor;
at least one of:
   bonding a sealing substrate to said face of the host substrate to seal said at least one open end of the reservoir, and
   bonding a sealing substrate on the top or bottom of the host substrate if at least one of one or more non-buried chambers, reservoirs, and connecting channels have been laser written on the top or bottom surface of the host substrate; and
diffusing the atomic vapor to reach the chamber.

\* \* \* \* \*